(12) United States Patent
Shimel et al.

(10) Patent No.: US 7,801,705 B2
(45) Date of Patent: Sep. 21, 2010

(54) MASS ON MODEL

(75) Inventors: Bruce D Shimel, Prairie, MO (US);
Scott W Stevenson, St. Louis, MO (US)

(73) Assignee: The Boeing Company, Chicago, IL (US)

( * ) Notice: Subject to any disclaimer, the term of this patent is extended or adjusted under 35 U.S.C. 154(b) by 679 days.

(21) Appl. No.: 11/183,706

(22) Filed: Jul. 18, 2005

(65) Prior Publication Data
US 2007/0016388 A1 Jan. 18, 2007

(51) Int. Cl.
G06F 17/50 (2006.01)
(52) U.S. Cl. .................................... 703/1; 703/2; 703/6
(58) Field of Classification Search .............. 703/1, 703/2, 6, 7, 13; 715/700
See application file for complete search history.

(56) References Cited

U.S. PATENT DOCUMENTS

| | | | | |
|---|---|---|---|---|
| 5,287,529 | A * | 2/1994 | Pentland | 708/446 |
| 5,991,122 | A * | 11/1999 | Tangren et al. | 360/244.2 |
| H2195 | H * | 7/2007 | Sisemore | 703/1 |
| 2002/0175948 | A1 * | 11/2002 | Nielsen et al. | 345/781 |
| 2003/0024622 | A1 * | 2/2003 | Chrobak | 152/518 |
| 2004/0107081 | A1 * | 6/2004 | Miyori et al. | 703/6 |
| 2007/0282571 | A1 | 12/2007 | Rassaian | |
| 2009/0189784 | A1 | 7/2009 | Lindgren | |

OTHER PUBLICATIONS

Jeremiah P. Ostriker and Michael L. Norman, "Cosmology of the early universe viewed through the new infrastructure", 1997, ACM, Communications of the ACM, vol. 40 issue 11, pp. 84-94.*

Peter Widas, "Introduction to Finite Element Analysis", 1997, Virginia Tech Material Science and Engineering, retrieved from www.sv.vt.edu on Apr. 21, 2008.*

Ashok Kumar et al., "Representation and Design of Heterogeneous Components", 1999, Solid Freeform Fabrication Proceedings, pp. 179-186.*

H. Weinans, et al., "The Behavior of Adaptive Bone-Remodeling Simulation Models", 1992, Pergamon Press Ltd., pp. 1425-1441.*

* cited by examiner

*Primary Examiner*—Jason Proctor
(74) *Attorney, Agent, or Firm*—Harness, Dickey & Pierce, P.L.C.

(57) ABSTRACT

In various embodiment of the present invention, a method for determining a mass distribution solution for a mathematical model of a part to be structurally analyzed is provided. The method includes utilizing a finite element modeling (FEM) device to generate a nodal data of a part to be structurally analyzed. The nodal data is exported into a mass distribution solution (MDS) generating device where a three dimensional graphical illustration of the nodal data is rendered on a monitor of the MDS generating device. Mass properties data relating to the part to be analyzed is then imported into the MDS generating device from a weight accounting data source (WAD). The MDS generating device includes a processor that executes a MDS algorithm to thereby generate a MDS for the nodal data based on the imported mass properties data. A three dimensional graphical illustration of the weight distribution across selected nodes of the nodal data in accordance with of the mass distribution solution is rendered on the monitor. The MDS generating device then exports the MDS to the FEM device where structural analysis of the part is performed.

23 Claims, 2 Drawing Sheets

MASS ON MODEL

FIELD OF INVENTION

The invention relates generally to routines or algorithms used to perform structural analysis, e.g. load and strength analysis, on structures or components of structures constructed, fabricated or manufactured to endure various loads and forces. More particularly, the invention relates to a process and algorithms for distributing mass data to finite element models.

BACKGROUND OF THE INVENTION

Finite element modeling (FEM) has become a well known tool used to perform structural analysis, e.g. load and strength analysis, of such things as the various parts of a mobile platform, cellular communication towers, bridge structures, high rise buildings and any other structure, part or compilation of parts fabricated to withstand various loads and forces. A finite element model (FEM) is generally a three-dimensional mathematic representation of a part subdivided into many smaller parts called elements. Various properties, such as mass, inertial forces and center of gravity (CG), and other properties of the part are utilized by the FEM to perform the structural analysis. Typically the part mass is distributed over the subdivided elements and input to a FEM routine or algorithm along with the other part properties, e.g. inertia and CG. The FEM routine then utilizes this data to perform structural analysis of the part.

Typically, distribution of part masses into a FEM routine are created by hand or by problem specific applications developed for each specific project. This process is very time consuming and, as FEM analysis continue to grow in size and complexity, this mass distribution process is becoming impractical. For example, it may be desirable in contemporary FEM analysis to subdivide a part into 20,000 elements or more, therefore, the process of mass distribution over 20,000 elements become very complex and labor and cost intensive. Although some automated, i.e. computerized, mass distribution programs have been implemented to reduce the time to create a mass distribution, they have many limitations. For example, some known mass distribution programs perform the distribution as a batch process, which prevents the individual inspection of each part's results.

Therefore, it is desirable to generate mass distributions for finite element modeling routines in a more accurate and time efficient manner.

BRIEF SUMMARY OF THE INVENTION

In various embodiments of the present invention, a method for determining a mass distribution solution for a mathematical model of a part to be structurally analyzed is provided. The method includes utilizing nodal data from a finite element model (FEM) device. The nodal data is exported into a mass distribution solution (MDS) generating device that executes a MDS algorithm is executed to render a three dimensional graphical illustration of the nodal data on a monitor of the MDS generating device. The nodal data include at a minimum a node identification number and X, Y, Z axial positions of each node, but may also include additional data that may be required for the MDS device, such as node stiffness or other FEM properties. Mass properties data relating to the part to be analyzed are then imported into the MDS generating device from a weight accounting data source (WAD), e.g. a weight accounting database. The MDS generating device includes a processor that executes the MDS algorithm to thereby generate a MDS for the nodal data based on the imported mass properties data. A three dimensional graphical illustration of the weight distribution across selected nodes of the nodal data in accordance with of the mass distribution solution is rendered on the monitor. The MDS generating device then exports the MDS to the FEM device where structural analysis of the part is performed.

The mass properties data includes such things as a weight of the part, a center of gravity of the part, moments of inertia of the part and shape factor data of the part. The MDS algorithm includes a node selector subroutine adapted to select a plurality of the nodes to distribute the weight of the part across. A distributor subroutine is also included in the MDS algorithm to mathematically distribute the weight of the part across the selected nodes. Additionally, the MDS algorithm includes a solver subroutine for modifying the weight distribution generated by the distributor subroutine so that particular mass properties of the nodal data substantially match predetermined target mass properties stored in the weight accounting data source. For ease and convenience of implementing new or modifying existing subroutines, the MDS algorithm is constructed to allow the node selector, distributor and solver subroutines to be easily deleted or modifies and for new node selector, distributor and solver subroutines to be added to the MDS algorithm.

The features, functions, and advantages of the present invention can be achieved independently in various embodiments of the present inventions or may be combined in yet other embodiments.

BRIEF DESCRIPTION OF THE DRAWINGS

The present invention will become more fully understood from the detailed description and accompanying drawings, wherein.

Corresponding reference numerals indicate corresponding parts throughout the several views of drawings.

DETAILED DESCRIPTION OF THE INVENTION

The following description of the preferred embodiments is merely exemplary in nature and is in no way intended to limit the invention, its application or uses. Additionally, the advantages provided by the preferred embodiments, as described below, are exemplary in nature and not all preferred embodiments provide the same advantages or the same degree of advantages.

Figure 1:
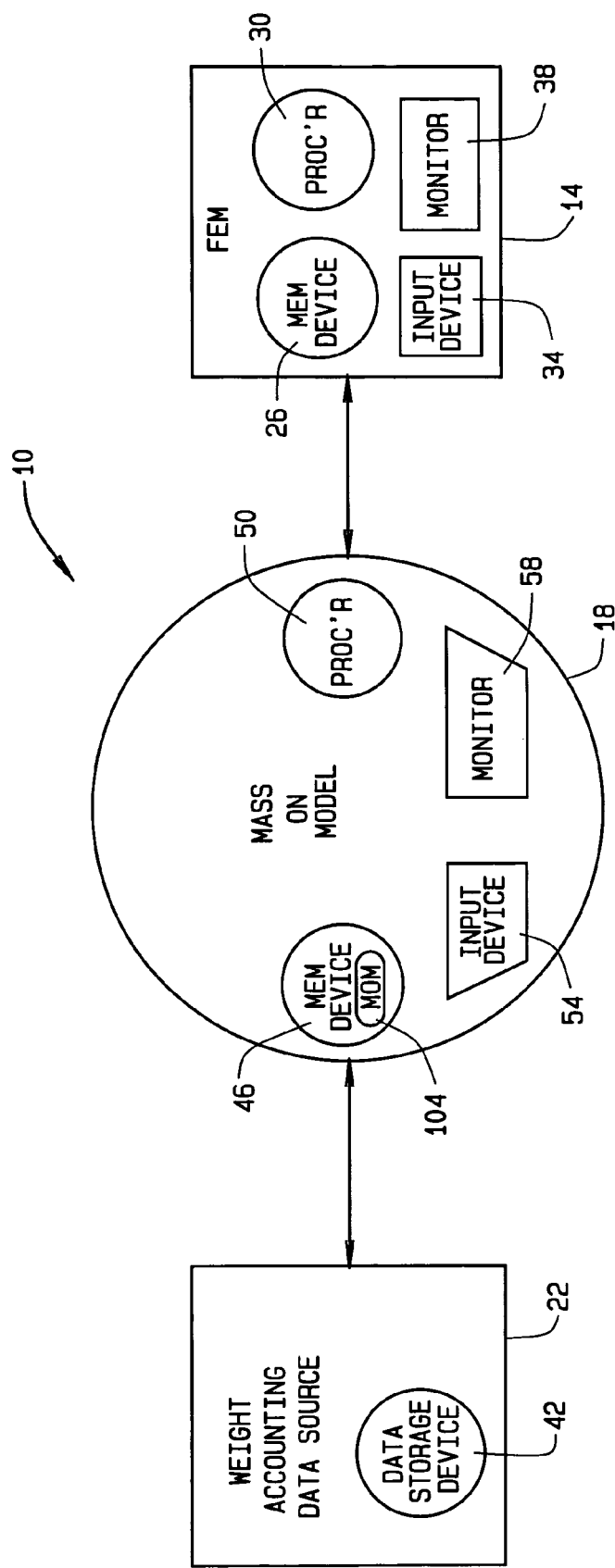
FIG. 1 is a block diagram of a structural analysis system, in accordance with various embodiments of the present invention.

FIG. 1 is a block diagram illustrating a structural analysis system (SAS) 10, in accordance with various embodiments of the present invention. The SAS 10 is utilized to perform structural analysis, e.g. load and strength analysis, of such things as the various parts, components or structures of a mobile platform, cellular communication towers, bridge, high rise buildings and any other structure, part or compilation of parts fabricated, constructed or manufactured to withstand various loads and forces. The SAS 10 includes a Finite Element Model device or module 14 that communicates with a Mass On Model device or module 18. The SAS 10 additionally includes a Weight Account Data source (WAD) 22 that also communicates with the MOM 18.

The FEM device 14 is a computer based subsystem of the SAS 10 containing typical computer system components. For example, the FEM device 14 includes a memory device 26 for storing such things as data, information and algorithms, a processors 30 for executing all functions of the FEM device 14, a data input device 34 for inputting data and operational commands, and a monitor 38 for viewing graphics, information and data input to and output from the FEM device 14. The WAD 22 includes one or more electronic data storage devices 42 on which data and information is electronically stored and imported to the MOM device 18, as described below. The MOM device 18 is also a computer based subsystem of the SAS 10 containing typical computer system components. For example, the MOM device 18 includes a memory device 46 for electronically storing such things as data, information and algorithms, a processor 50 for executing all functions of the MOM device 18, a data input device 54 for inputting data and operational commands, and a monitor 58 for viewing graphics, information and data input to and output from the MOM device 18. For example, the MOM device 18 could be a user's desk top or laptop computer.

Generally, the FEM device 14 generates data to mathematically and graphically represent a particular part, component, structure or any portion thereof to be structurally analyzed, herein referred to as the 'part' to be analyzed. This data is imported by the MOM device 18, which also imports weight, inertia, center of gravity (CG) data and other data from the WAD 22 that relates to the part to be analyzed. The MOM 14 utilizes all the imported data to generate mass distribution solution that includes data indicating how weight, and therefore mass, should be distributed throughout the part such that the part will have desired inertial forces and center of gravity.

The data generated by the FEM device 14 mathematically and graphically represents the part divided into a plurality of elements having a node, i.e. a point mass, at each corner of each element. The nodes virtually represent the part as point masses that make up the part. Thus, graphically, the data generated by FEM device 14 illustrates the part as a plurality of dots, i.e. nodes. The part can be divided into any number of elements, and therefore nodes, based on the degree of analysis desired. For example, the part can be divided into ten, one thousand, ten thousand or any other number of elements. The WAD 22 stores predetermined mass properties data regarding the part, such as, the weight of the part, the CG of the part along a X, Y and Z axes ($X_{cg}$, $Y_{cg}$, $Z_{cg}$) and the moments of inertia along the X, Y and Z axes ($I_{xx}$, $I_{yy}$, $I_{zz}$) The MOM device 18 imports the part node data from the FEM device 14 and the corresponding property data from the WAD 22, then generates the mass distribution solution, as described below. The mass distribution solution is then exported back to the FEM device 14 where the FEM device 14 utilizes the data from mass distribution solution to perform structural analysis on the part.

Weight Accounting Data Source

As described above, the WAD 22 includes at least one electronic data storage device 42. The electronic data storage device(s) 42 can be any known suitable resident or removable medium for electronically storing information and data. The WAD 22 can contain predetermined property data relating to any number of parts to be analyzed. For example, the WAD 22 can include data relating to all the parts, components and structures, or any portion of a part, component or structure that comprise an entire mobile platform, such as an aircraft, bus, train or ship. The property data for each part is stored in data fields within the WAD 22. The part property data included in the data fields for each part include, but are not limited to, a key value used to identify the part, name of the part, description of the part, weight of the part, the CG of the part with respect to the X, Y and Z axes (Xcg, Ycg, Zcg), the moments of inertia along the X, Y and Z axes (Ixx, Iyy, Izz), and the products of inertia of the part along the X, Y and Z axes (Pxy, Pyz, Pxz). Additional data fields may include minimum and maximum boundaries of the part with respect to the X, Y and Z axes (Xmin, Xmax, Ymin, Ymax, Zmin, Zmax). The data stored in the WAD 22 can include actual measured values, approximated values and/or empirically obtained values.

Finite Element Model

Finite element analysis is a known method of performing load and strength analysis of structures intended to withstand various forces. The data model used in the finite element analysis is generally referred to as a finite element model (FEM). FEM models generally generate represent a part subdivided into many smaller parts called elements. The various properties, such as weight, inertial forces and center of gravity (CG) are distributed over the subdivided elements and input to a FEM routine or algorithm along with the other part properties, e.g. inertia and CG. The FEM routine then utilizes this data to perform structural analysis of the part. Typically, distribution of part weights over the elements are calculated and input into the FEM routine by hand.

The FEM device 14 imports a model of the part to be analyzed from any suitable part modeling system, for example a CAD system. The FEM device 14 then divides the model into any desired number of elements having a node at each corner of every element, thereby creating nodal data of the part to be analyzed. The FEM device 14 randomly selects the orientation and location of the elements and nodes using any suitable algorithm, e.g. a commercial program called PATRAN. Thus, the FEM device 14 can generate any desirable number of nodes, e.g. two thousand or twenty thousand, that are merely distributed throughout the part model. The FEM device 14 is adapted to export the nodal data of the part to the MOM device 18. As described in detail below, the MOM device 18 imports part property data from the WAD 22 for the nodal data imported by the MOM device 18, i.e. exported from the FEM device 14.

Figure 2:
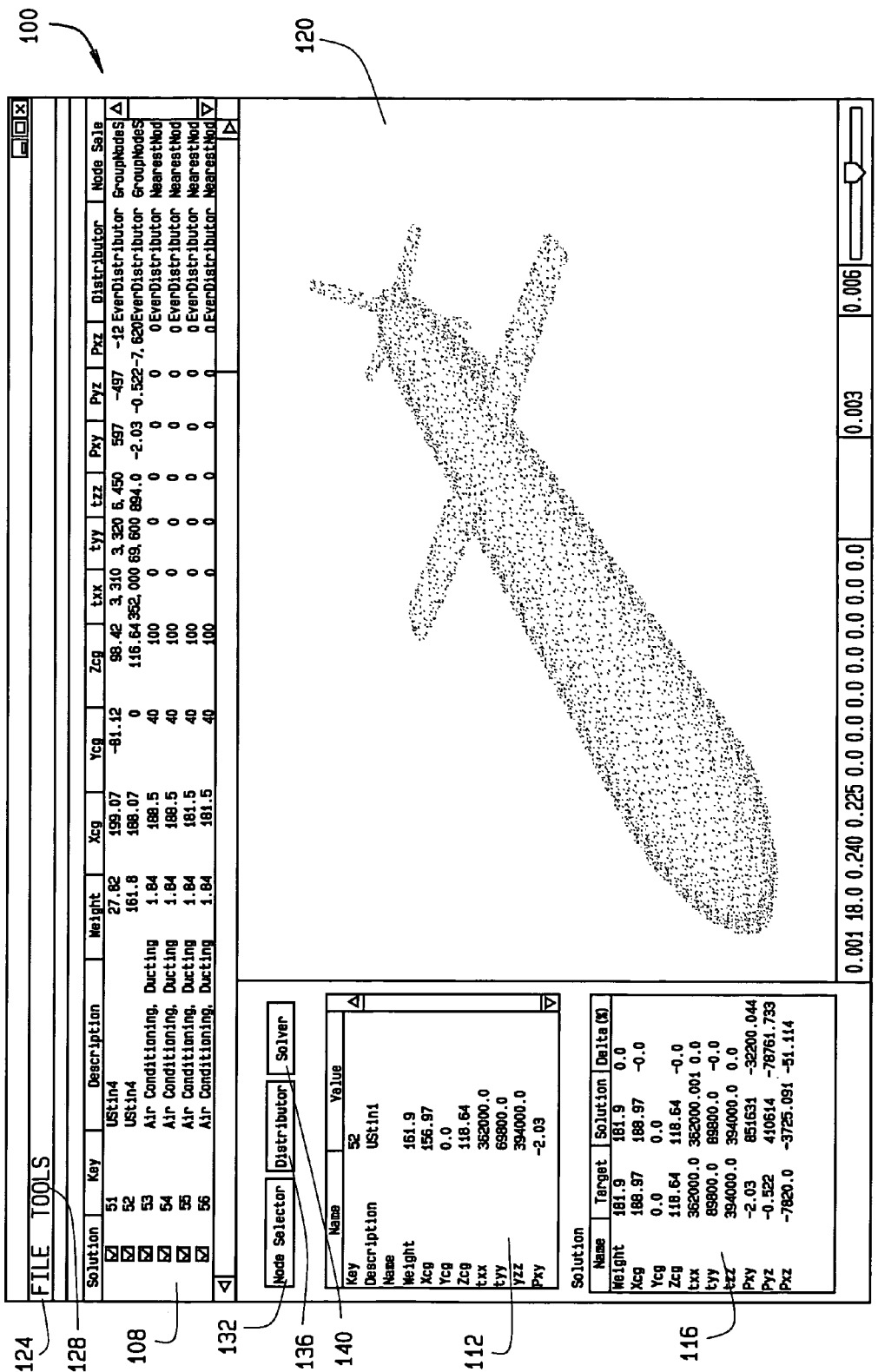
FIG. 2 is a screen shot of a mass distribution solution generating page of a Mass On Model (MOM) device/module shown in FIG. 1.

In various embodiments, the FEM device 14 also places strength property data on the nodes of the nodal data exported to the MOM device 18. The strength property data is utilized by the MOM device 18 to generate the mass distribution solution exported back to the FEM device 14. Therefore, the MOM device 18 will generate a more accurate mass distribution solution by not assigning a weight value to a node that represents a point on the actual part that could not structurally bear the weight or assigning weights to various nodes that would cause forces at different nodal location that could not bear such forces. Such nodes can be identified by FEM properties, such as stiffness, that may be provided with the nodal data Mass on Model Referring now also to FIG. 2, a screen shot of a mass distribution solution (MDS) generating page 100 produced during execution of a MOM routine 104 stored in the MOM memory device 46 and executed by the MOM processor 50, is illustrated. The MOM routine 104 is a mass distribution solution algorithm or program for generating a mass distribution solution for the nodal data imported from the FEM device 14, Generally, the MOM device 18 imports the nodal data from the FEM device 14 and the property data related to the modeled part from the WAD 22, then executes the MOM routine 104 to generate the mass distribution solution. More particularly, execution of the MOM routine selects specific nodes to which the part weight is to be distributed utilizing a Node Selector subroutine, distributes the part weight across the selected nodes utilizing a Distributor subroutine and solves, i.e. generates the mass distribution solution, whereby the weight is distributed such that other part properties that are affected by the weight distribution, e.g. CG and inertial moments, are obtained to substantially match desired values utilizing a Solver subroutine. In various embodiments, the desired part property values are the part property values imported from the WAD 22.

Execution of the MOM routine 104 generates the MDS page 100 that includes a part table 108, a properties table 112, solution table 116 and a nodal data display window 120. The part table 108 displays the property data imported from the WAD 22 relating to a plurality of parts that may be modeled by the FEM device 14. For example, the part table 108 can display the key, description, weight, center of gravity values $X_{cg}, Y_{cg}, Z_{cg}$, the inertial values $I_{xx}, I_{yy}, I_{zz}$, the product of inertia values $P_{xy}, P_{yz}, P_{xz}$ and the minimum and maximum boundaries $X_{min}, X_{max}, Y_{min}, Y_{max}, Z_{min}, Z_{max}$ of a plurality of parts. The properties table 112 displays the property data for the nodal data imported from the FEM device 14. In operation, a user can select a particular part from the part table 108 for which the user wishes to import a nodal data from the FEM device 14. The MOM routine 104 then imports the desired nodal data and displays the related property data in the properties table 112. The solution table 116 displays the part property values that result when part weight is distributed across the selected nodes in accordance with the generated mass distribution solution, the part properties imported from the WAD 22 for the selected nodal data imported from the FEM 14, i.e. the desired or target part properties, and the difference between the values. Ideally, if the MOM routine 104 generates a viable mass distribution solution, the solution values are substantially equal to the target values. The nodal data display window 120 provides a three dimensional graphical illustration of the nodal data imported from the FEM device 14.

The MDS page 100 additionally includes a File pull-down menu button 124 that provides typical Microsoft Windows file selections such as Open, Close, Print, Import and Export operations. A Tools File pull-down menu button 128 provides typical Microsoft Windows tool selections such as Customize and Options operations. Furthermore, the MDS page 100 includes a Node Selector pull-down menu button 132, a Distributor pull-down menu button 136 and a Solver pull-down menu button 140. In various embodiments, the pull-down menu buttons 132, 136 and 140 are buttons that generate respective dialog boxes to select a desired Node Selector, Distributor and Solver subroutines, described below. Additionally, each dialog box generated by pull-down menu buttons 132, 136 or 140 can have a custome dialog, or editor, for further specifying parameters. The Node Selector pull-down menu button 132 activates a pull-down menu or dialog box that provides a list of one or more different node selector subroutines, wherein each node selector subroutine selects the specific nodes to which the part weight is to be distributed based on different criteria.

For example, a node selector subroutine might select nodes based on proximity, for example located within a given radius of the part center of gravity, or FEM groups, i.e., nodes that have been selected and added to a named group using a FEM application, such as PATRAN.

Another node selector subroutine might select nodes based a shape factor where the nodes selected to distribute weight are selected based on a particular shape. For example, if the part to analyze has the general shape of a cone, a shape factor based node selector may select one or more node groups that substantially form a cone encompassing toward the center of gravity of the part. Yet another node selector subroutine might select nodes based on geometric intersections of two or more plane within the modeled part. For example the point or area of where two or more planes intersect may indicate an area of the modeled part that is stronger than other areas or points. Therefore, the geometric intersections based node selector routine would select a higher density of nodes for which the weight is to be distributed near such a geometric intersection. Still further, another node selector subroutine is a bounding box subroutine that allows a user to designate a three dimensional box by selecting $X_{min}, X_{max}, Y_{min}, Y_{max}, Z_{min}$ and $Z_{max}$ values within the nodal data. The bounding box subroutine then distributes the weight over any nodes that fall within that box. Yet another node selector subroutine is a combination node selector subroutine that allows a user to use multiple node selector subroutines.

Still further, the node selector subroutines might include a spline curve based subroutine, which would select nodes within a specified radius around a spline curve drawn through the FEM model, this would be used to select nodes for a wire bundle or hydraulic line, for example. Other node selector subroutines are a nearest node selector subroutine and a point mass node selector subroutine. A nearest node selector would select nodes with a given radius or distance from the part's center of gravity with options for specifying criteria such as the maximum number of nodes to select. A point mass node selector would select a single node within the FEM to put the part's mass properties, including inertia properties.

Generally, the user will choose a node selector that will substantially accurately represent that part taking into consideration other characteristic of the modeled part that the FEM device 14 does not account for when generating the nodal data of the selected part. For example, the FEM device 14 may not account for such things as rivet use in fabricating the part to be modeled or sealants or paint that will ultimately be applied to the part to be modeled.

The Distributor pull-down menu button 136 activates a pull-down menu or dialog box that provides a list of one or more different distributor subroutines that distribute the weight of the modeled part over the selected nodes. Each of the various distributor routines provided via the Distributor pull-down menu button 136 distribute the part weight across the selected nodes based on different criteria. For example, an even distributor subroutine will evenly distribute the weight across the selected nodes. That is, the even distributor subroutine divides the part weight by the number of selected nodes and distributes the weight proportionately such that each of the selected nodes will be assigned a substantially equal weight value.

Another distributor subroutine may distribute the weight based on physical characteristics of the modeled part. For example, if the modeled part has a generally uniform thickness or density, the distributor subroutines may distribute the weight substantially uniformly over the selected nodes. However, if the modeled part has a generally non-uniform thickness or density, e.g. a portion of the modeled part is thinner or less dense, the distributor subroutines may proportionally assign greater weight values over the selected nodes within the thicker or more dense portion of the modeled part and lesser weight values over the selected nodes within the thinner or less dense portion of the modeled part.

Another distributor subroutine may allow a user to manually dictate how the weight is distributed across the selected nodes utilizing the MOM input device 54. For example, the user could input a curve that assigns greater weight values to certain ones or groups of the selected nodes and lesser weight values to other ones or groups.

Further yet the list of distributor subroutines may include a point mass distributor subroutine that simply places the part's mass properties, including the inertia properties, on the selected node. The inertia properties will be transformed to the location of the selected node in order to maintain the initial part inertia properties.

The Solver pull-down menu button 140 activates a pull-down menu or dialog box that provides a list of one or more different solver subroutines, wherein each solver subroutine solves the weight distribution based on different criteria. That is, based on differing criteria, each solver subroutine modifies, e.g. tweaks or fine tunes, the weight distribution so that particular mass properties of the modeled part that result from the weight distribution generated by the distributor subroutine substantially match the target or desired mass properties. Preferably, the target mass properties are substantially equal to the known or pre-established mass properties of the actual physical part that has been rendered into the nodal data, as describe above. For example, the list of solver subroutines may include a non-solver routine that generates the mass distribution solution based simply on the weight distribution resulting from the selected distribution subroutine. That is, the non-solver subroutine does not alter or modify the weight distribution provided by the selected distribution subroutine. The non-solver routine is useful for verifying the initial distribution and can be useful when the distribution provides a better representation of the part's mass properties than what is recorded in the weight accounting data source. Another solver subroutine provided may include a gradient search solver, for example, LMDIF, that modifies the weight distribution resulting from the selected distribution routine to generate a mass distribution solution that provides the desired CG and inertial moments that substantially match known values of the CG and inertial moments for the part mathematically modeled by the SAS 10.

The gradient search solver subroutine utilizes a basis function and gradient search to generate a mass distribution solution that provides the desired CG and inertial moments. The gradient search solver and other solver subroutines attempt to match the distributed mass properties, i.e. CG and inertial moments, to the actual known part mass properties of the modeled part. Generally, the solver subroutines attempt to match the part mass properties by making minor modifications or shifts in the weight values of weight distribution resulting from the selected distribution subroutine. That is, the solver subroutine tries to keep the distributed weight values as close to those generated by the distribution subroutine while making very small incremental weight distribution changes to obtain the desired part mass properties.

It should be understood that the MOM routine 104 is constructed to be easily modified to add or delete selector, distributor and solver subroutines provide via the node selector, distributor and solver pull-down menu buttons 132, 136 and 140. Or, features of any of the node selector, distributor and solver subroutines could be added, deleted or modified to the mass distribution solution algorithm. Additionally, fields of part, property and solutions tables 108, 112 and 116 can be easily added, deleted and/or modified. For example, other fields such as a shape factor field, which specifies the basic shape and dimensions of the part, can be added to the parts table 108. Any additional data related to added fields would be stored in the WAD 22 and imported to the MOM device 18 in the same manner as other property data is stored and imported as described above.

Once the mass distribution solution is generated, the MOM routine 104 graphically illustrates, via the nodal data display window 120, the weight distribution across the selected nodes and center of gravity in accordance with the mass distribution solution. For example, the MOM routine 104 may illustrate the weight assigned to each node by varying the size or color of each node. Additionally, in various embodiments, the MOM routine 104 graphically illustrates, via the nodal data display window 120, the target center of gravity such that the user can visually verify whether the generated center of gravity matches the target center of gravity. Additionally other properties can be illustrated by altering the size or color of the nodes shown in the nodal data illustrated in the nodal data display window 120.

Additionally, in various embodiments the nodal data display window 120 includes an information bar 144 that interactively illustrates the weight and mass property values of selected nodes. For example, if a user places a cursor or pointer over or 'clicks' on a particular node using the MOM input device 54, e.g., a mouse or keyboard, the information bar 144 will show the values for that node. For example, the information bar 144 will show the weight, center of gravity values Xcg, Ycg, Zcg, the moment of inertia values Ixx, Iyy, Izz, the product of inertia values Pxy, Pyz, Pxz and the minimum and maximum boundaries Xmin, Xmax, Ymin, Ymax, Zmin, Zmax of the selected node.

It should be understood that once a mass distribution solution is generated, a different solver subroutine and/or different distributor subroutine and/or a different node selector subroutine can be selected to generate another, more desirable, mass distribution solution. Once the user has visually verified that the MOM routine 104 has generated a desired mass distribution solution, the mass distribution solution is exported to the FEM device 14. The user can visually verify the mass distribution solution using the values illustrated in the solution table 116. Additionally, user can visually verify the mass distribution solution using the graphical representation shown in nodal data display window 120 illustrating the weight distribution and other mass properties of each node by size and color of the nodes and a center of gravity indicator, e.g. a location within the nodal data identified by a particular colored dot. In various embodiments the user utilizes a Mass distribution solution Export command provided via the File pull-down menu 124 to export the mass distribution solution to the FEM device 14. The MOM routine 104 can format the mass distribution solution in any desirable format interpretable by the FEM device 14, e.g., MSC Nastran CONM2 format.

In various embodiments, wherein the MOM device 18 is a user's desktop or laptop computer or the like, the MOM routine 104 is adapted to run in the background of a users computer such that the user can utilize the computer to perform other work while the MOM routine 104 is being executed. Additionally, the MOM routine itself is multi-threaded and can calculate solutions for parts while the user further defines node selectors, distributors, and solvers for other parts. Additionally, in various embodiments the MOM routine 104 can be executed to substantially simultaneously generate mass distribution solutions for a plurality of parts selected from the part table 108. A solution column may be provided in the part table 108 that indicates when a mass distribution solution for a selected part has been generated.

Therefore, the structural analysis system 10 implements the MOM device 18 to rapidly distribute concentrated part masses onto a Finite Element Model (FEM). That is, the MOM device 18 executes the MOM routine 104 to distribute actual part mass properties i.e. weight, center of gravity, and inertia from the WAD 22 onto the FEM device 14 for structural analysis, e.g. load and strength analysis. The MOM routine 104 provides an interactive environment and allows the mass distribution solution to be visualized and checked for accuracy. This is a critical improvement since many distributions can effectively match the part mass properties. However, even though the distribution may match the aggregate part properties, it may not accurately represent the real distribution of mass. Visualization allows the engineer to perform a sanity check and make adjustments as necessary. Additionally, the MOM routine 104 provides an extensible architecture that allows for additional node selection, distribution, and solver subroutines to be added.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification and following claims.

What is claimed is:

1. A computer-performed method for distributing part mass data onto a finite element model, said method comprising the steps of:
    in a graphic display, displaying target property values pre-established for a plurality of properties of a part;
    selecting nodes from the finite element model to represent the part, the selecting performed using a selector method selected by a user;
    distributing among at least some of the selected nodes a pre-established mass value and only the pre-established mass value, the distributing performed using a distributor method selected by the user;
    determining values for a plurality of aggregate properties of the selected nodes resulting from the mass value distribution;
    modifying the mass value distribution among the selected nodes to obtain a modified mass value distribution that results in the aggregate properties of the selected nodes having values closer than the corresponding determined values to corresponding ones of the pre-established target property values for the part, the modifying performed using a solver method selected by the user;
    the method performed at least in part by at least one computer having a processor and memory.

2. The method of claim 1, wherein the pre-established mass value is expressed as a weight value.

3. The method of claim 1, wherein the target property values include a center of gravity of the part, and moments of inertia of the part.

4. The method of claim 1, further comprising the processor using, in one of the selector methods, one or more characteristics of the part not associated with the part by the finite element model.

5. The method of claim 1, wherein the selector methods include one or more of the following: a proximity node selector subroutine, a FEM groups node selector subroutine, a shape factor node selector subroutine, a geometries intersections node selector subroutine, a bounding box node selector subroutine, a spline curve node selector subroutine, a radius node selector subroutine, a point mass node selector subroutine and a combination node selector subroutine.

6. The method of claim 1, further comprising the processor displaying a center of gravity of the modified mass distribution across the selected nodes.

7. The method of claim 1, further comprising the processor:
    displaying a weighting of each of the selected nodes in accordance with the modified mass distribution;
    receiving a selection by the user of one of the displayed weighted nodes; and
    displaying one or more property values specific to the selected one of the weighted nodes.

8. The method of claim 1, wherein the distributor methods include one or more of the following: an even distributor subroutine, a physical characteristics distributor subroutine, a manual distributor subroutine and a point mass distributor subroutine.

9. The method of claim 1, wherein the solver methods include one or more of the following: a non-solver subroutine, and a gradient search solver subroutine.

10. The method of claim 1 further comprising the processor:
    generating a three dimensional graphical illustration of the selected nodes; and
    generating a three dimensional graphic illustration of a weight distribution over the selected nodes in accordance with the modified mass distribution.

11. A method for determining a mass distribution solution for a finite element model representing one or more parts, said method performed using a structural analysis system including one or more processors and memory and a graphic display, the method comprising the steps of:
    using the graphic display, choosing one of one or more selector methods from a menu of the structural analysis system;
    using the chosen selector method, selecting from the finite element model a plurality of nodes to represent a part;
    using the graphic display, choosing one of one or more distributor methods from the menu;
    using the chosen distributor method, distributing among at least some of the selected nodes a mass value pre-established for the part, without distributing aggregate values pre-established for other properties for the part;
    determining aggregate values for one or more inertial properties of the selected nodes resulting from the mass value distribution;
    using the graphic display, choosing one of one or more solver methods from the menu; and
    using the chosen solver method, modifying the mass value distribution among the selected nodes to obtain a modified mass distribution that results in the one or more inertial properties of the selected nodes having aggregate values closer than the one or more corresponding determined aggregate values to corresponding target values pre-established for the part
    said method performed using a structural analysis system including one or more processors and memory and a graphic display.

12. The method of claim 11, wherein the pre-established target property values include a center of gravity of the part, moments of inertia of the part and shape factor data of the part.

13. The method of claim 11, wherein using the chosen distributor method comprises refraining from assigning a mass value to a given one of the selected nodes based on strength property data associated with the given node by the finite element model.

14. The method of claim 11, wherein the selector methods include one or more of the following: a proximity node selector subroutine, a FEM groups node selector subroutine, a shape factor node selector subroutine, a geometries intersections node selector subroutine, a bounding box node selector subroutine, a spline curve node selector subroutine, a radius node selector subroutine, a point mass node selector subroutine and a combination node selector subroutine.

15. The method of claim 11, wherein the distributor methods include one or more of the following: an even distributor subroutine, a physical characteristics distributor subroutine, a manual distributor subroutine and a point mass distributor subroutine.

16. The method of claim 11, further comprising, based on the comparing, inputting the modified mass distribution to the finite element model.

17. The method of claim 11, wherein the solver methods include one or more of the following: a non-solver subroutine, and a gradient search solver subroutine.

18. The method of claim 11, wherein the pre-established mass value is expressed as a weight value.

19. The method of claim 11, further comprising selecting nodes for a part from the finite element model based at least in part on one or more characteristics of the part not associated with the part by the finite element model.

20. A system for determining a mass distribution solution for a finite element model, said system comprising:
- a graphic display, and one or more processors and memory having instructions executable by the one or more processors:
- to display in the graphic display (a) target property values pre-established for properties of a part, and (b) a menu making available to a user one or more selector methods, one or more distributor methods, and one or more solver methods;
- to select nodes for the part from a finite element model, the selecting performed using a selector method selected by a user from the menu;
- to distribute among at least some of the selected nodes a mass value pre-established for the part, without distributing aggregate values pre-established for other properties for the part, the distributing performed using a distributor method selected by the user from the menu;
- to compare aggregate values for a plurality of properties of the selected nodes resulting from the mass distribution with corresponding ones of the pre-established target values; and
- based on the comparison, to modify the mass value distribution among the selected nodes to obtain a modified mass distribution that shifts the aggregate values for the plurality of properties of the selected nodes toward the corresponding pre-established target values, the modifying performed using a solver method selected by the user from the menu.

21. The system of claim 20, further configured to display the selected nodes and a weight distribution for each displayed node on the graphic display, the node weight distribution provided in accordance with the modified mass distribution.

22. The system of claim 20, the one or more processors and memory further having instructions executable by the one or more processors to refrain from assigning a mass value to a given node, based at least in part on strength property data associated with the given node by the finite element model.

23. The system of claim 20, the one or more processors and memory further having instructions executable by the one or more processors to select nodes for a part from the finite element model based at least in part on one or more characteristics of the part not associated with the part by the finite element model.

* * * * *